United States Patent
Kastner et al.

(10) Patent No.: US 6,790,726 B2
(45) Date of Patent: Sep. 14, 2004

(54) METHOD FOR PRODUCING AN INTEGRATED SEMICONDUCTOR MEMORY CONFIGURATION

(75) Inventors: Marcus Kastner, Taipei (TW); Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/609,805

(22) Filed: Jun. 30, 2003

(65) Prior Publication Data
US 2004/0082117 A1 Apr. 29, 2004

Related U.S. Application Data

(63) Continuation of application No. PCT/DE01/04767, filed on Dec. 14, 2001.

(30) Foreign Application Priority Data

Dec. 29, 2000 (DE) .......................... 100 65 669

(51) Int. Cl.⁷ .......................................... H01L 21/8242
(52) U.S. Cl. ..................... 438/253; 438/928; 438/396
(58) Field of Search ................. 438/253–255, 438/257–258, 396–399, 928

(56) References Cited

U.S. PATENT DOCUMENTS

| | | | |
|---|---|---|---|
| 4,959,709 A | | 9/1990 | Watanabe |
| 4,978,635 A | | 12/1990 | Watanabe |
| 5,318,916 A | * | 6/1994 | Enquist et al. ............... 438/320 |
| 5,661,063 A | * | 8/1997 | Lee ............................. 438/253 |
| 5,684,316 A | | 11/1997 | Lee |
| 5,959,322 A | * | 9/1999 | Lee ............................. 257/298 |
| 5,976,953 A | * | 11/1999 | Zavracky et al. ............ 438/455 |
| 6,300,179 B1 | * | 10/2001 | McKee ........................ 438/206 |
| 6,330,181 B1 | * | 12/2001 | McKee ........................ 365/149 |
| 6,423,596 B1 | * | 7/2002 | McKee ........................ 438/253 |
| 6,441,424 B1 | * | 8/2002 | Klose et al. ................. 257/308 |
| 6,458,638 B2 | * | 10/2002 | Kim ............................. 438/157 |
| 6,569,734 B2 | * | 5/2003 | McKee ........................ 438/253 |
| 6,593,184 B2 | * | 7/2003 | Han ............................. 438/253 |

FOREIGN PATENT DOCUMENTS

| | | |
|---|---|---|
| DE | 38 40 559 A1 | 6/1989 |
| JP | 02106958 A | 4/1990 |
| JP | 05243521 | 9/1993 |

* cited by examiner

Primary Examiner—John F. Niebling
Assistant Examiner—Jennifer M. Kennedy
(74) Attorney, Agent, or Firm—Laurence A. Greenberg; Werner H. Stemer; Ralph E. Locher

(57) ABSTRACT

A method for producing an integrated semiconductor memory configuration includes forming two capacitor modules for each selection transistor from the front and rear side of the substrate wafer respectively. Thus, a higher packing density of memory cells is engendered by the utilization of the rear side of the wafer. A twofold memory read signal can be used for the same cell surface area. Conditions in addition to "0" or "1" can also be saved for each selection transistor in a ferroelectric memory configuration, if the two capacitor modules have a different structure in terms of layer thickness, surface area, or material.

10 Claims, 4 Drawing Sheets

Fig. 1
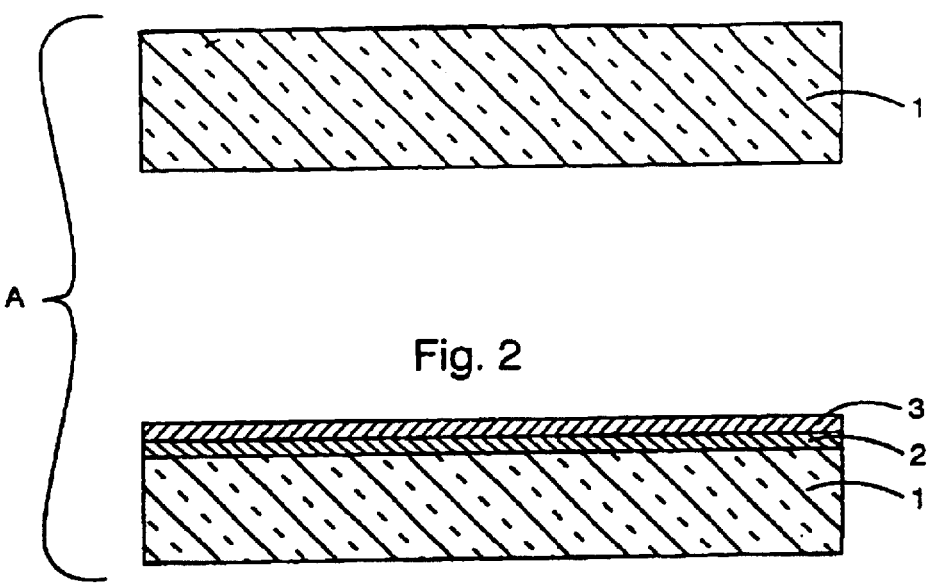
Fig. 2
Fig. 3
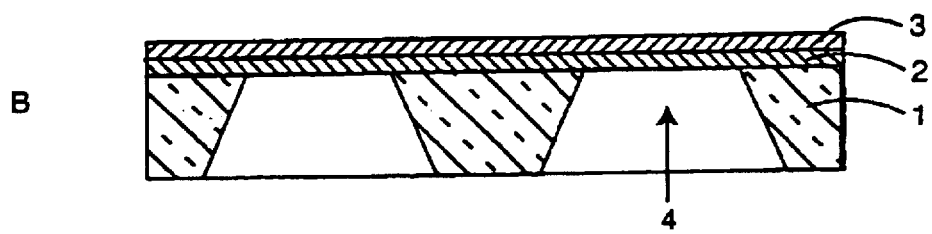
Fig. 4
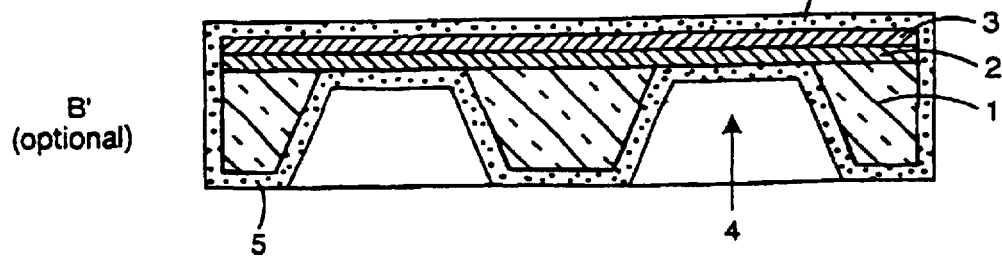

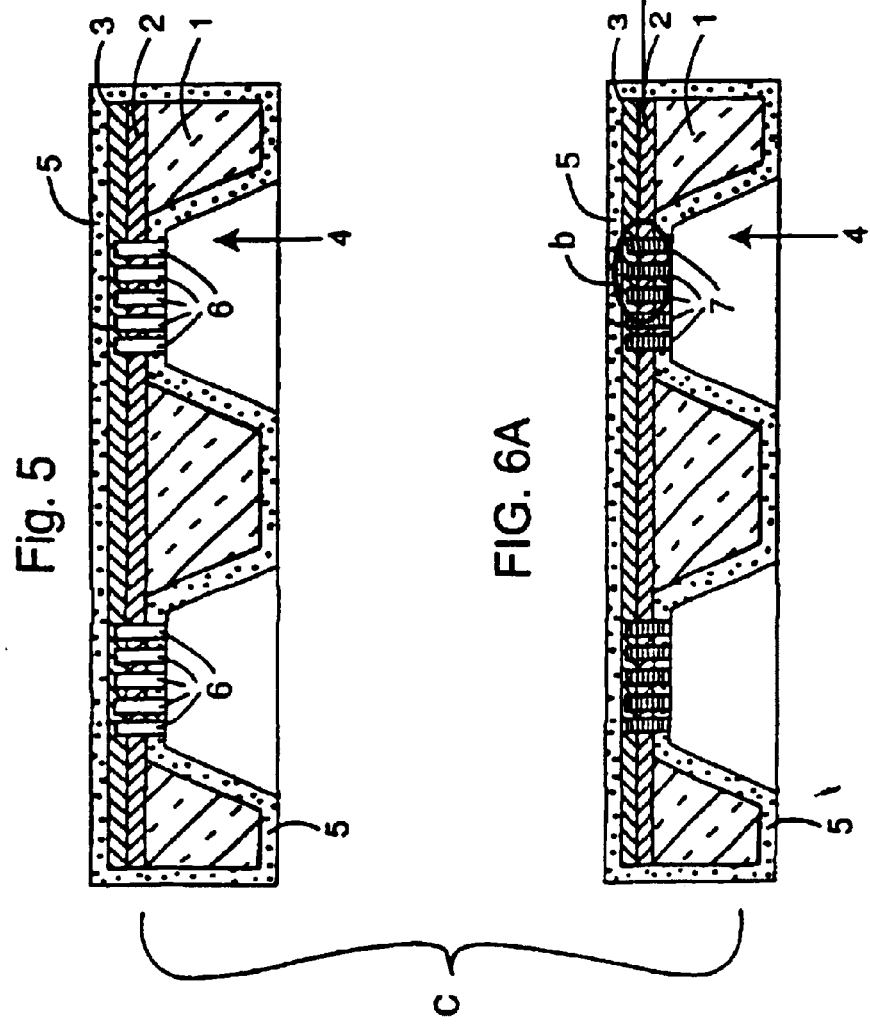

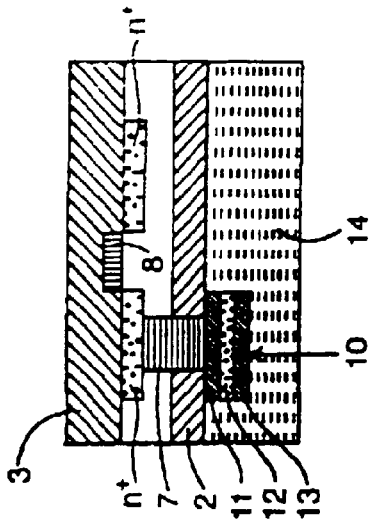
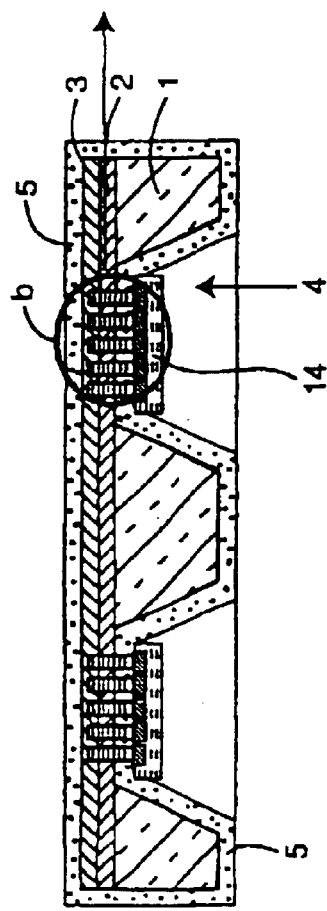
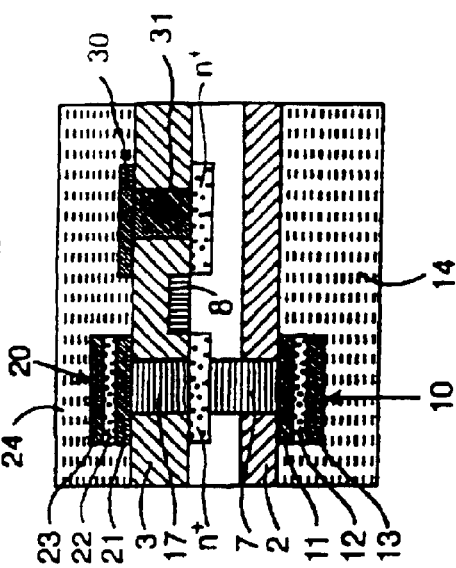
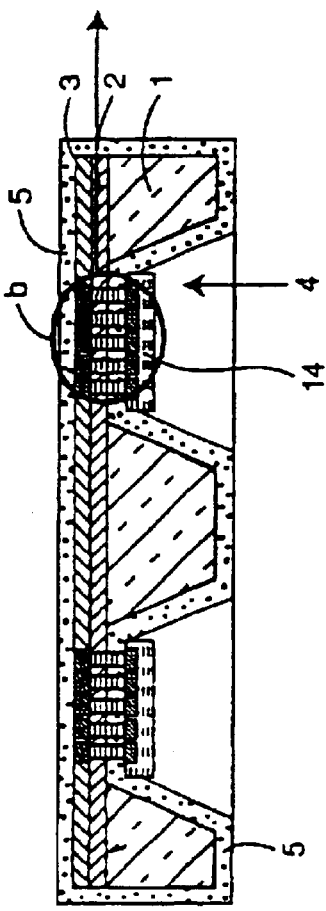

Fig. 9 Order of Process Steps

| claim 2 | | claim 3 | |
|---|---|---|---|
| steps: | Figs.: | steps: | Figs.: |
| A | 1, 2 | A ⎤ | 1, 2 |
| B | 3 | E ⎬ | 8A, 8B |
| (B') | 4 | F ⎦ | |
| C | 5, 6, 6B | B | 3 |
| D | 7A, 7B | C | 5, 6, 6B |
| E, F | 8A, 8B | D | 7A, 7B |

METHOD FOR PRODUCING AN INTEGRATED SEMICONDUCTOR MEMORY CONFIGURATION

CROSS-REFERENCE TO RELATED APPLICATION

This application is a continuation of copending International Application No. PCT/DE01/04767, filed Dec. 14, 2001, which designated the United States and was not published in English.

BACKGROUND OF THE INVENTION

FIELD OF THE INVENTION

The invention relates to a method for producing an integrated ferroelectric or DRAM semiconductor memory configuration on a wafer substrate, as disclosed, for example, in Japanese Patent document JP 05243521 A together with the associated abstract.

The magnitude of the polarization that can be changed over or the charge that can be stored on the capacitor plates is of crucial importance for the functionality and also the reliability of ferroelectric memories (FeRAMs) and DRAMs with a high dielectric constant $\epsilon$. The voltage on the bit line (BL) that is caused by the polarization or charge during reading must not fall below a minimum value specified for the product. In the simplest case, the BL signal can be increased by enlarging the capacitor area, but this is accompanied by an increase in the chip area.

Attempts have already been made to increase the BL signal by reducing the thickness and also by construction optimizations (low bit line capacitance) and also by a suitable choice of the ferroelectric or dielectric (high dielectric constant $\epsilon$). However, technological limits are imposed on these routes because these measures usually entail enlargement of the capacitor area to the detriment of the packing density.

In known memory cells, usually, only one storage capacitor is addressed per selection transistor. Consequently, it is also the case that only one bit of information can be stored for each address.

The abovementioned Japanese Patent document 05243521 A (abstract) shows a DRAM memory cell in which, in order to increase the storage capacitance of the storage capacitor while maintaining a minimum chip occupation area, two storage capacitors with first and second electrodes that are interleaved in one another in a comb-like manner are formed in an insulating substrate layer such that they are symmetrical with regard to a source electrode and a drain electrode of the selection transistor. In accordance with FIG. 1 of this Japanese Patent document, respective electrodes of these storage capacitors lying one above the other are jointly electrically connected to the drain region of the selection transistor.

German Published, Non-Prosecuted Patent Application DE 38 40 559 A1, corresponding to U.S. Pat. Nos. 4,978,635 and 4,959,709 to Watanabe, describes a semiconductor memory device and a production method provided therefor, in which a storage capacitance element connected to a source or drain electrode of a selection transistor embodied as a MOSFET is formed from the rear side of a silicon substrate. The storage capacitance element is formed as a trench capacitor in a trench produced from the rear side of the silicon substrate.

U.S. Pat. No. 5,684,316 to Lee describes a semiconductor memory device with two storage capacitors formed above and below a cell transistor. The method described therein that is used to form the storage capacitors proceeds such that firstly a first storage capacitor is formed on the topside of a first substrate. The structure of the first storage capacitor is, then, connected to a second substrate, and the resulting structure is rotated such that the previous top side faces downward. Afterward, the cell transistor structure including two transistors is constructed and, finally, a second storage capacitor is produced thereabove.

SUMMARY OF THE INVENTION

It is accordingly an object of the invention to provide a method for producing an integrated semiconductor memory configuration, in particular, for a DRAM or a ferroelectric semiconductor memory configuration, that overcomes the hereinafore-mentioned disadvantages of the heretofore-known devices and methods of this general type and that makes possible a higher packing density of the memory cells or achieves a significantly higher read signal for the same cell area.

With the foregoing and other objects in view, there is provided, in accordance with the invention, an integrated ferroelectric or DRAM semiconductor memory configuration produced on a wafer substrate, a selection transistor and two storage capacitors that can be addressed by the selection transistor being formed per memory cell, and forming the two storage capacitors for each memory cell respectively from the front and rear sides of the substrate.

The method is characterized by the following steps:

A) preparation of a substrate wafer and formation of electrode regions of the selection transistor as CMOS transistor from the front side of the wafer;

B) etching a recessed region in the rear side of the wafer;

C) formation of a first electrically conductive plug within the recessed region so that the first plug makes contact with an electrode region of the selection transistor formed in the step (A);

D) formation of a first storage capacitor in the recessed region from the rear side of the wafer so that an electrode plate of the first storage capacitor, which electrode plate faces the electrode region of the selection transistor, is electrically conductively connected to the electrode region of the selection transistor by the plug formed in the step (C);

E) formation of a second electrically conductive plug from the front side of the wafer so that the second plug comes into contact with the same electrode region of the selection transistor; and F) formation of a second storage capacitor from the front side of the wafer so that an electrode plate of the second storage capacitor, which electrode plate faces the electrode region of the selection transistor, comes into contact with the electrode region of the selection transistor by the second plug formed in step (E).

In a particular configuration, it is desirable to be able to store more states than only either 0 or 1 per memory cell, i.e., per address.

In one procedure, steps (A) to (F) may be performed in the above-indicated order. An alternative method procedure combines steps (A), (E), and (F) and performs them before the subsequent steps (B), (C), and (D).

Yet another alternative method forms the storage capacitors on the two wafer sides in parallel, i.e., approximately simultaneously, and performs as many etchings, depositions, maskings, etc. as possible on the two wafer sides.

By incorporating the rear side of the wafer, it is possible to achieve a more effective utilization of the chip area of an integrated semiconductor memory configuration produced in this way. The proposed process forms two storage capacitors that can be addressed by the same selection transistor and require the same chip area as previously required by just one storage capacitor. The capacitance-forming area of the associated storage capacitors and, thus, the stored charge or polarization, thus, increase by two-fold for the same chip area. This can be utilized either in the form of an increased reliability (higher bit line signal) or in a further reduction of the chip area.

In accordance with another mode of the invention, there is provided the step of introducing a first insulating layer in the recessed region from the rear side of the wafer and covering the first storage capacitor to electrically insulate the first storage capacitor with the first insulating layer and protect the first storage capacitor from damage by subsequent processing steps.

In accordance with a further mode of the invention, there is provided the step of applying a second insulating layer to the front side of the wafer and covering the storage capacitor to electrically insulate the second storage capacitor with the second insulating layer and protect the second storage capacitor from damage by subsequent processing steps.

If, in a ferroelectric memory configuration in accordance with one proposal of the present invention, the ferroelectric films of the two storage capacitors are formed with different thicknesses and/or the areas of the two storage capacitors are formed with different sizes and/or the chemical compositions of the ferroelectrics of the two storage capacitors are formed differently, such a procedure makes it possible to store two bits per address, i.e., per selection transistor. By way of example, if the ferroelectric films in the two storage capacitors are deposited with different thicknesses, the coercive voltages (i.e., the voltage at which the polarization starts to switch) have different values. Depending on the magnitude of the read-out voltage, it is possible to address only one or both storage capacitors. By a corresponding evaluation circuit, it is, then, possible to differentiate four states (00, 01, 10, 11) at one address. In addition to the different thickness of the ferroelectrics, it is possible, as mentioned, to differentiate the two storage capacitors also in terms of their area or in terms of their material and, thus, in terms of the stored charge/polarization. The voltage levels during reading, then, permit conclusions in respect of which or whether both storage capacitors were at a high level or low level.

Other features that are considered as characteristic for the invention are set forth in the appended claims.

Although the invention is illustrated and described herein as embodied in a method for producing an integrated semiconductor memory configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a fragmentary, cross-sectional view of a semiconductor substrate wafer in a production step of the method according to the invention for producing an integrated ferroelectric memory configuration;

FIG. 2 is a fragmentary, cross-sectional view of a semiconductor substrate wafer in a production step of the method according to the invention for producing an integrated ferroelectric memory configuration;

FIG. 3 is a fragmentary, cross-sectional view of a semiconductor substrate wafer in a production step of the method according to the invention for producing an integrated ferroelectric memory configuration;

FIG. 4 is a fragmentary, cross-sectional view of a semiconductor substrate wafer in a production step of the method according to the invention for producing an integrated ferroelectric memory configuration;

FIG. 5 is a fragmentary, cross-sectional view of a semiconductor substrate wafer in a production step of the method according to the invention for producing an integrated ferroelectric memory configuration;

FIG. 6A is a fragmentary, cross-sectional view of a semiconductor substrate wafer in a production step of the method according to the invention for producing an integrated ferroelectric memory configuration;

FIG. 6B is a fragmentary, enlarged cross-sectional view of a portion of the semiconductor substrate wafer of FIG. 6A;

FIG. 7A is a fragmentary, cross-sectional view of a semiconductor substrate wafer in a production step of the method according to the invention for producing an integrated ferroelectric memory configuration;

FIG. 7B is a fragmentary, enlarged cross-sectional view of a portion of the semiconductor substrate wafer of FIG. 7A;

FIG. 8A is a fragmentary, cross-sectional view of a semiconductor substrate wafer in a production step of the method according to the invention for producing an integrated ferroelectric memory configuration; and FIG. 8B is a fragmentary, enlarged cross-sectional view of a portion of the semiconductor substrate wafer of FIG. 8A.

FIG. 9 depicts a table for explaining alternative orders of process steps.

DESCRIPTION OF THE PREFERRED EMBODIMENTS

Referring now to the figures of the drawings in detail and first, particularly to FIGS. 1 and 2 thereof, there is shown a first production step of an exemplary embodiment of a production method according to the invention for producing an integrated ferroelectric memory configuration. In accordance with the cross-sectional illustrations shown in FIGS. 1 and 2, in a step A, a semiconductor substrate wafer 1 prepared for the production of an integrated ferroelectric memory configuration is provided, which may either be a silicon-on-insulator wafer (SOI) or has an electrochemical etching stop through ion implantation. FIG. 2 shows that a CMOS-FEOL process is carried out in a layer 3 as far as an intermediate oxide 2. optionally, instead of the CMOS-FEOL process, it is also possible to perform a complete production process that produces the electrode regions of the selection transistors and the metallization regions from the front side and the front-side storage capacitors from the front side of the wafer.

In accordance with FIG. 3, in a step B, recessed regions 4 are formed from the rear side of the wafer 1 by an anisotropic etching process as far as the depth defined by a suitable etching step (e.g., SOI). As an alternative, it is also possible to effect etching for a fixed time without an etching stop.

By a further (optional) step B', in accordance with FIG. 4, it is possible to deposit a barrier layer 5 over the entire region on the front and rear sides of the wafer 1.

FIG. 5 shows that vias 6 are etched from the rear side of the wafer 1 as far as electrode regions (see n⁺ in FIG. 6B) of the CMOS selection transistors, which electrode regions lie in the semiconductor layer 3 and FIG. 6A shows that these vias 6 are, then, filled with a suitable conductive material, for example, polysilicon, tungsten, or copper, to form conductive plugs 7. The enlarged region b of FIG. 6A that is illustrated in FIG. 6B shows that the plugs 7 make contact with an electrode region n⁺ of a selection transistor 8 in the semiconductor layer 3.

By a further step D, which is shown in FIG. 7A and in an enlarged illustration in FIG. 7B, a first storage capacitor 10 is formed in an insulating layer 14 deposited from the rear side of the wafer 1 in the recessed regions 4. The first storage capacitor 10 has a first electrode plate 11, which is connected to the electrode region n⁺ of the selection transistor 8 by the plug 7, and a second electrode plate 13 with a ferroelectric 12 lying between the two electrode plates 11 and 13.

Step E, shown in FIGS. 8A and 8B, forms a further plug 17 from the front side of the wafer 1 per selection transistor 8, which plug makes contact with the same electrode region n⁺ of the selection transistor 8. In a further step F, a second storage capacitor 20 including the electrode plates 21 and 23 with a ferroelectric layer 22 lying in-between is formed in a further insulating layer 24 formed on the front side of the wafer 1. The electrode plate 21 of the second storage capacitor 20, which electrode plate 21 faces the selection transistor 8, is in contact, by the plug 17, with the same n⁺-type electrode region of the selection transistor 8 as the electrode plate 11—lying opposite in the thickness direction of the wafer—of the first storage capacitor 10.

In principle, the above-described production steps A–F can be performed in the above-described order. An alternative production method combines all the process steps A, E, and F performed from the front side of the wafer 1 and these steps are performed before the, then, subsequent steps B, C, and D that form the elements of the ferroelectric memory configuration from the rear side of the wafer 1.

In a further alternative non-illustrated production method, the two storage capacitors 10, 20 can be produced in parallel from the two sides of the wafer, as many layers and elements as possible being formed simultaneously on the two sides of the wafer.

The enlarged illustration of FIG. 8B additionally shows that a second n⁺-type electrode region of the selection transistor 8 is connected to a metallization plane 30, for example, a bit line, through a further plug 31.

The production method according to the invention makes it possible to produce two storage capacitors per selection transistor respectively in the front and rear sides of the wafer 1, which capacitors are addressed by the same selection transistor. As a result, the capacitor area and, thus, the stored charge/polarization increase by two-fold for the same chip area. This is manifested either in the form of an increased reliability (higher bit line signal) or in a further reduction of the chip area.

In the case of a ferroelectric memory, the concept described makes it possible to store two bits per address (i.e., per selection transistor). To that end, by way of example, the ferroelectric films 12, 22 of the two storage capacitors 10, 20 are deposited with different thicknesses. Their coercive voltages (i.e., the voltages at which the polarization starts to switch) then have different values in each case. Depending on the magnitude of the read-out voltage, one or both storage capacitors 10, 20 can be addressed. By a corresponding evaluation circuit, it is, then, possible to differentiate four states (00, 01, 10, 11) at one address. In addition to a different thickness of the ferroelectrics, the two storage capacitors can, also, be differentiated in terms of their capacitance-forming area or their material and, thus, in terms of the stored charge/polarization. The voltage levels during reading, then, permit conclusions in respect of which or whether both storage capacitors were at high or low.

One skilled in the art here will readily recognize that the above-described method steps only describe the processes that are significant to the invention, and that the figures referred to are, therefore, only diagrammatic. It goes without saying that, in practice, more than the two recesses 4 illustrated are formed from the rear side of the substrate and more than just 5 cells with the respectively associated two storage capacitors 10, 20 and selection transistors 8 are formed in each recess 4.

We claim:

1. A method for producing an integrated ferroelectric or DRAM semiconductor memory configuration on a wafer substrate, which comprises:

forming memory cells having a selection transistor and two storage capacitors addressed by the selection transistor per memory cell and respectively forming the two storage capacitors for each memory cell from front and rear sides of the wafer substrate by:

A) preparing a substrate wafer and forming electrode regions of the selection transistor as a CMOS transistor from the front side of the wafer;

B) etching a recessed region in the rear side of the wafer;

C) forming a first electrically conductive plug within the recessed region to contact the first plug with an electrode region of the selection transistor formed in step A;

D) forming a first storage capacitor in the recessed region from the rear side of the wafer to electrically conductively connect an electrode plate of the first storage capacitor, which electrode plate faces the electrode region of the selection transistor, to the electrode region of the selection transistor through the first plug formed in step C;

E) forming a second electrically conductive plug from the front side of the wafer to contact the second plug to the electrode region of the selection transistor contacted with the electrode plate of the first storage capacitor, and F) forming a second storage capacitor from the front side of the wafer to electrically conductively connect an electrode plate of the second storage capacitor, which electrode plate faces the electrode region of the selection transistor, to the electrode region of the selection transistor through the second plug formed in step E.

2. The method according to claim 1, which further comprises carrying out steps A to F in alphabetical order.

3. The method according to claim 1, which further comprises combining and performing steps A, E, and F before steps B, C, and D.

4. The method according to claim 1, which further comprises introducing a first insulating layer in the recessed region from the rear side of the wafer and covering the first storage capacitor to electrically insulate the first storage capacitor with the first insulating layer and protect the first storage capacitor from damage by subsequent processing steps.

5. The method according to claim 1, which further comprises applying a second insulating layer to the front side of the wafer and covering the storage capacitor to electrically insulate the second storage capacitor with the second insulating layer and protect the second storage capacitor from damage by subsequent processing steps.

6. The method according to claim 4, which further comprises applying a second insulating layer to the front side of the wafer and covering the storage capacitor to electrically insulate the second storage capacitor with the second insulating layer and protect the second storage capacitor from damage by subsequent processing steps.

7. The method according to claim 1, which further comprises:

forming a ferroelectric memory configuration with the memory cells; and forming each of the first and second storage capacitors with a ferroelectric film having different thicknesses.

8. The method according to claim 1, which further comprises:

forming a ferroelectric memory configuration with the memory cells; and forming capacitance-forming areas of the first and second storage capacitors with different sizes.

9. The method according to claim 1, which further comprises:

forming a ferroelectric memory configuration with the memory cells; and forming materials of the first and second storage capacitors with a respectively different chemical composition.

10. The method according to claim 1, which further comprises:

forming a ferroelectric memory configuration with the memory cells; and forming materials of ferroelectric films of the first and second storage capacitors with a respectively different chemical composition.

* * * * *